(12) United States Patent
Mueller

(10) Patent No.: US 8,531,198 B2
(45) Date of Patent: Sep. 10, 2013

(54) APPARATUS AND METHOD FOR ELECTROSTATIC DISCHARGE (ESD) REDUCTION

(75) Inventor: Bernhard Gunter Mueller, Finsing (DE)

(73) Assignee: Applied Materials, Inc., Santa Clara, CA (US)

( * ) Notice: Subject to any disclaimer, the term of this patent is extended or adjusted under 35 U.S.C. 154(b) by 501 days.

(21) Appl. No.: 12/816,798

(22) Filed: Jun. 16, 2010

(65) Prior Publication Data
US 2011/0291683 A1 Dec. 1, 2011

(30) Foreign Application Priority Data
May 26, 2010 (EP) .................................... 10163959

(51) Int. Cl.
*G01R 31/02* (2006.01)
(52) U.S. Cl.
USPC ................................................... 324/754.08
(58) Field of Classification Search
USPC ............... 324/762.01–762.1, 754.01–754.3, 324/755.01–755.1
See application file for complete search history.

(56) References Cited

U.S. PATENT DOCUMENTS

| | | | | |
|---|---|---|---|---|
| 6,160,411 A | * | 12/2000 | Eliashberg et al. | 324/750.05 |
| 6,326,220 B1 | * | 12/2001 | Chen et al. | 438/14 |
| 6,512,391 B2 | * | 1/2003 | Cowan et al. | 324/750.03 |
| 6,914,423 B2 | * | 7/2005 | Nordgren et al. | 324/756.01 |

FOREIGN PATENT DOCUMENTS

| | | |
|---|---|---|
| EP | 1 826 813 | 8/2007 |
| JP | 11-219882 | 8/1999 |
| WO | WO-2010/016504 | 2/2010 |

OTHER PUBLICATIONS

Extended European Search Report dated Sep. 23, 2010 for European Patent Application No. 10163959.9.
PCT international search report and written opinion of PCT/EP2011/058362 dated Jul. 13, 2011.

* cited by examiner

*Primary Examiner* — Tung X Nguyen
(74) *Attorney, Agent, or Firm* — Patterson & Sheridan, LLP

(57) ABSTRACT

A substrate support unit adapted for a system for testing or processing of a substrate is provided. The substrate support unit includes a support table having at least one substrate carrier structure adapted to support a substrate, wherein the substrate carrier structure is electrically floating with respect to ground.

21 Claims, 11 Drawing Sheets

APPARATUS AND METHOD FOR ELECTROSTATIC DISCHARGE (ESD) REDUCTION

BACKGROUND OF THE INVENTION

1. Field of the Invention

Embodiments of the present invention generally relate to a test and/or process system for substrates and a method of testing and/or processing substrates, in particular to test systems for glass substrates and a method of testing electronic structures on glass substrates. More particularly, the invention relates to an integrated testing system for large area substrates in the production of flat panel displays. Specifically, embodiments relate to an assembly for reducing electrostatic discharge, a substrate support unit, an apparatus for testing or processing electronic devices on a substrate, a method for reducing electrostatic discharge, and a method for testing and/or processing a plurality of electronic devices on a large area substrate.

2. Description of the Related Art

Flat panel displays have recently become more and more common and are widely used as a replacement for the cathode ray tubes displays. Generally, different types of flat panel displays can be used. For example, active matrix liquid crystal displays (LCDs) are one type of displays. Further, displays including OLEDs or plasma displays may also be used. LCDs, OLED displays or plasma displays have several advantages over the CRTs, including higher picture quality, lighter weight, lower voltage requirements, and low power consumption. The displays have many applications in computer monitors, cell phones, televisions and the like.

Generally, electronic control of pixel elements on a substrate is provided for LCDs, OLEDs or Plasma displays. For example, an active matrix LCD includes a liquid crystal material sandwiched between a thin film transistor (TFT) array substrate and a color filter substrate to form a flat panel display. The TFT substrate includes an array of thin film transistors, each coupled to a pixel electrode, and the colour filter substrate which includes different colour filter portions and a common electrode. When a certain voltage is applied to a pixel electrode, an electric field is created between the pixel electrode and the common electrode, orienting the liquid crystal material to allow light to pass therethrough for that particular pixel.

During manufacturing of displays, testing of the flat panel substrate is required to determine the operability of the individual pixels. Voltage imaging, charge sensing, and electron beam testing are some processes used to monitor and troubleshoot defects during the manufacturing process. For example, during electron beam testing, the response of a pixel is monitored to provide defect information. In one example of electron beam testing, certain voltages are applied to the pixel electrodes, and an electron beam may be directed to the individual pixel electrodes under investigation. Secondary electrons emitted from the pixel electrode area are sensed to determine the electrode voltages. Other testing procedures might be provided for LCD displays, such as TFTs, OLED displays and plasma displays. Generally, for testing procedure, a substrate carrying the display or a portion of the display is disposed in or on a testing apparatus.

The size of the processing equipment as well as the throughput is of great concern to flat panel display manufacturers, both from a financial standpoint and a design standpoint. Thereby, flat panel displays or substrates for flat panel displays and other large area electronic equipment have to be carefully treated in order to not decrease the yield of the manufacturing process. Current flat panel display processing equipment of generation 8.5 (G 8.5) generally accommodates large area substrates up to about 2200 mm by 2500 mm and larger. Electrostatic discharge has been observed when handling large area substrates which may cause defects. The demand for larger displays, increased production and lower manufacturing costs has created a need for improved processing and testing systems that can improve the yield of substrates found to meet the production criteria.

Therefore, there is a need for a test system to perform testing on large area substrates and methods for testing of large area substrates whereby an improved substrate treatment can be provided.

SUMMARY OF THE INVENTION

In light of the above, a substrate support unit according to independent claim 1, an apparatus for testing or processing electronic devices on a substrate according to independent claim 10 and a method for handling a substrate according to independent claim 13 are provided.

According to one embodiment, a substrate support unit is provided. The substrate support unit is adapted for a system for testing or processing of a substrate and includes a support table having at least one substrate carrier structure adapted to support a substrate, wherein the substrate carrier structure is electrically floating with respect to ground.

In one embodiment, an apparatus for testing or processing a substrate is provided. The apparatus includes: a chamber for having a substrate disposed therein; and a substrate support unit having at least one substrate carrier structure adapted to support the substrate when placed thereon, wherein the substrate carrier structure is electrically floating to ground.

In another embodiment, a method for testing or processing a substrate is provided. The method includes: loading the substrate on a substrate carrier structure provided in a chamber, wherein the substrate carrier structure is electrically insulated from ground; performing at least one of testing and processing the substrate; unloading the substrate from the substrate carrier structure; electrically connecting the substrate carrier structure with ground.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
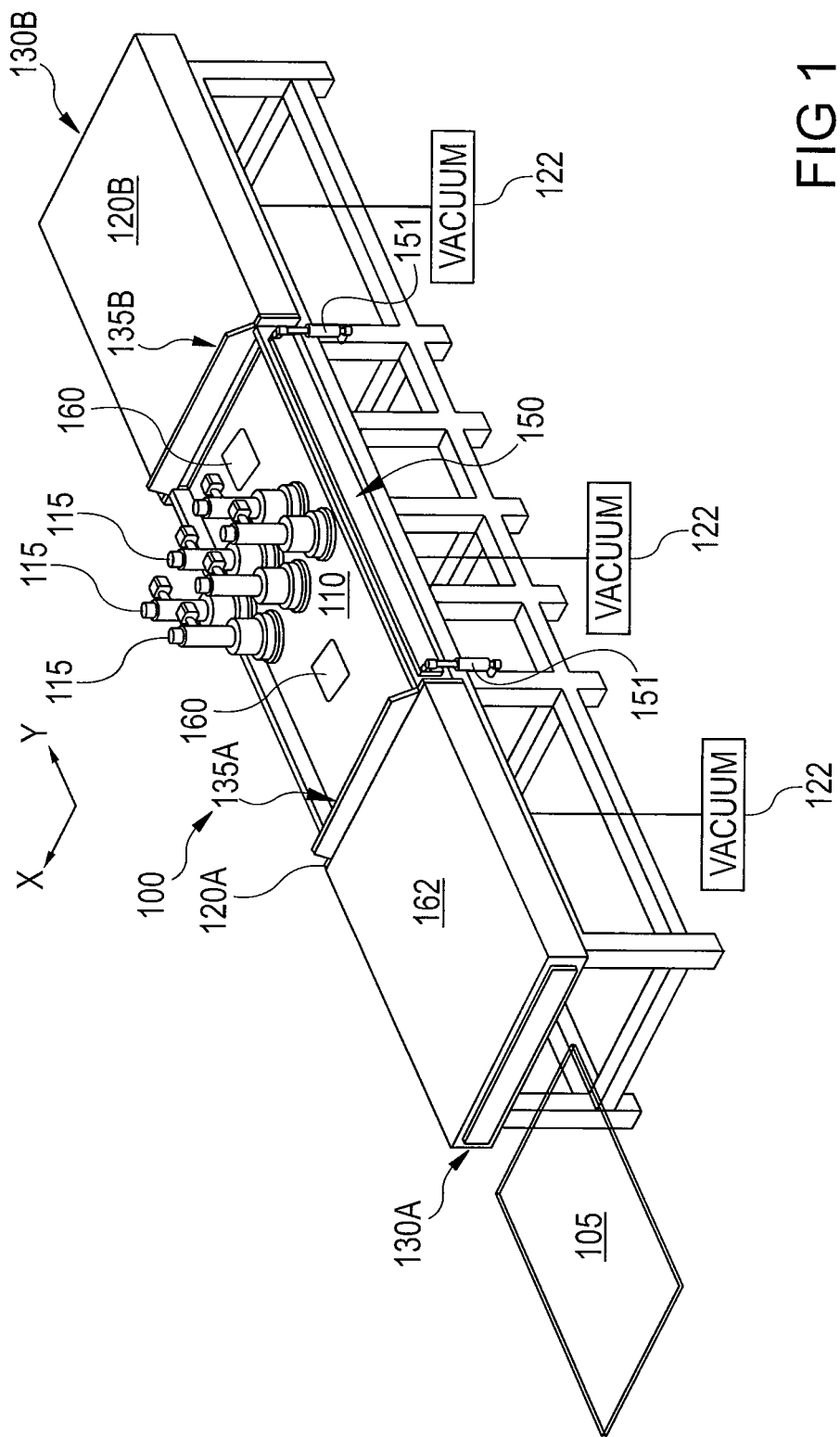
FIG. 1 shows a test system for which embodiments described herein can be used.

To facilitate understanding, identical or similar reference numerals have been used, where possible, to designate identical elements that are common to the figures. It is contemplated that elements disclosed in one embodiment may be beneficially utilized on other embodiments without specific recitation.

DETAILED DESCRIPTION

As describe herein the term electronic device or electronic elements refers to electrodes, connections, TFTs, displays, one or more electrically conductive layers or the like, which are provided on a substrate, particularly dielectric substrates, for example a glass substrate. Such electronic devices or elements can be used for flat panel displays like LCD displays, OLED displays or plasma displays.

Embodiments described herein can be used for a variety of test and processing applications. For simplicity, in the following, it is referred to testing of displays with an electron beam. However, other test apparatuses and test methods, e.g., with a light optical beam, may also utilize embodiments described herein. According to yet further embodiments, which can be combined with other embodiments described herein, ESD (electrostatic discharge) voltage reduction can also be applied to PVD or CVD processing tools or other ESD critical applications, wherein a substrate is moved to and from a substrate carrier structure.

As a further example, embodiments described herein can be incorporated in or conducted on AKT EBT test tools, such as EBT 15ki, 25k, 25ki, 40ki, 49k, 55k, 55ki or 90k, also in CVD and PVD tools.

The term substrate as used herein refers generally to large area substrates made of, for example, an dielectric material such as glass, a polymeric material, or other substrate materials suitable for having an electronic device formed thereon. Embodiments depicted in this application refer to various drives, motors and actuators that may be one or a combination of the following: a pneumatic cylinder, a hydraulic cylinder, a magnetic drive, a stepper or servo motor, a screw type actuator, or other type of motion device that provides vertical movement, horizontal movement, combinations thereof, or other device suitable for providing at least a portion of the described motion.

Various components described herein may be capable of independent movement in horizontal and vertical planes. Vertical is defined as movement orthogonal to a horizontal plane and will be referred to as the Z direction. Horizontal is defined as movement orthogonal to a vertical plane and will be referred to as the X or Y direction, the X direction being movement orthogonal to the Y direction, and vice-versa. The X, Y, and Z directions will be further defined with directional insets included as needed in the figures to aid the reader. Thereby, it is to be understood that the coordinate systems are used for easier reference and that other coordinate systems, which are non-orthogonal, or which slightly deviate from an orthogonal coordinate system in light of manufacturing inaccuracies or the like, may still be provided for embodiments according to the invention.

FIG. 1 illustrates embodiments of a test system 100, e.g. an in-line test system, adapted to test various properties, such as the operability of electronic devices located on large area flat panel substrates. For example, the large area substrates can have dimensions up to and exceeding about 1920 mm by about 2250, for example for present generation G8.5 2200 mm by 2500 mm, and larger. The test system 100 includes a testing chamber 110, one or more load lock chambers 120A, 120B and a plurality of testing columns 115 (six are shown in FIG. 1). According to different embodiments, the one or more testing columns 115, can be charged particle beam columns such as electron beam columns, light optical columns including a light modulator based on capacitive coupling or any device adapted to test electronic devices located on large area substrates. The electronic devices can be thin film transistors (TFTs), electrodes, connection to electrodes. According to different embodiments, which can be combined with other embodiments described herein, the electronic devices provide or carry a charge corresponding to a pixel or sub-pixel of a flat panel display. The test system 100 is typically located in a clean room environment and may be part of a manufacturing system that includes substrate handling equipment such as robotic equipment or a conveyor system that transports one or more large area substrates to and from the testing system 100.

The one or more load lock chambers 120A may be disposed adjacent and connected to the testing chamber 110 on one side, or on both sides of the testing chamber 110 by a valve 135A disposed between load lock chamber 120A and the testing chamber 110, and a valve 135B disposed between load lock chamber 120B and the testing chamber 110. The load lock chambers 120A, 120B facilitate transfer of large area substrates to and from the testing chamber 110 and to and from ambient environment by a transfer robot and/or a conveyor system typically located in the clean room environment. In one embodiment, the one or more load lock chambers 120A, 120B may be a dual slot load lock chamber configured to facilitate transfer of at least two large area substrates. Examples of a dual slot load lock chamber are described in U.S. Pat. No. 6,833,717, issued on Dec. 21, 2004, and U.S. patent application Ser. No. 11/298,648, issued on Dec. 7, 2006 as US 2006/0273815A1, entitled "Substrate Support with Integrated Prober Drive", both of which are incorporated herein by reference to the extent the applications are not inconsistent with this disclosure.

According to some embodiments, the load lock chamber 120A can be adapted to receive the substrate from the clean room environment through an entry port 130A, while the load lock chamber 120B has an exit port 130B which selectively opens to return the large area substrate to the clean room environment. According to yet other embodiments, one or more load lock chambers can be provided, wherein each load lock chamber is adapted for loading and unloading a substrate. The load lock chambers 120A, 120B are sealable from ambient environment and are typically coupled to one or more vacuum pumps 122, and the testing chamber 110 may be coupled to one or more vacuum pumps 122 which are separate from the vacuum pumps of the load lock chambers 120A, 120B. An example of various components of an electron beam test system for testing large area substrates are described in U.S. Pat. No. 6,833,717, issued on Dec. 21, 2004, entitled "Electron Beam Test System with Integrated Substrate Transfer Module," previously incorporated by reference. Thereby, according to typical embodiments, which can be combined with other embodiments described herein, after the load lock chamber and the test chamber have been evacuated to a similar pressure, a valve such as a slit valve between the chambers is opened and an end effector connected to a robot moves from the test chamber into the load lock chamber, lifts the substrate and retracts into the test chamber while carrying the substrate. The substrate can then be positioned above or on a substrate carrier structure of a support table in the test chamber 110 as will be described in more detail below.

According to yet further embodiments, which can be combined with other embodiments described herein, the load lock chamber and/or the test chamber may have a microscope for inspecting portions of the substrate in the load lock chamber and/or the test chamber. Examples of a microscope are described in U.S. patent application Ser. No. 11/375,625 (US 2006/0244467), entitled "In-Line Electron Beam Test System", filed Mar. 14, 2006, which is incorporated herein by reference to the extent the application is not inconsistent with this disclosure.

According to some embodiments, the test system 100 is configured to transport a large area substrate 105 having electronic devices located thereon through a testing sequence along a single directional axis, shown in the figure as the Y axis. In other embodiments, the testing sequence may include a combination of movements along the X and Y axis. In other embodiments, the testing sequence may include Z directional movement provided by one or both of the testing columns 115 and a movable stage of the support table within the testing chamber 110. The substrate 105 may be introduced into the test system 100 along either the substrate width or substrate length. The Y directional movement of the substrate 105 in the test system allows the system dimensions to be slightly larger than the width or length dimensions of the substrate 105.

According to some embodiments, which can be combined with other embodiments described herein, one or more voltage measurement units 160 can be provided in a test system, as shown in FIG. 1. Therefore, according to some embodiments, the voltage measurement unit is adapted for measuring an absolute value of the voltage of the substrate in the test system, i.e., the potential of the substrate with regard to ground. The voltage measuring unit 160 can be used to measure the electrical potential on the substrate during different processing steps. This will be explained in more detail with respect to FIGS. 3A to 6.

The test system 100 may also include a movable support table or a support table having at least one movable stage configured to move in at least a Y direction through the test system 100. Alternatively, the substrate 105, with or without a support table, may be transferred through the test system by a conveyor, a belt system, a shuttle system, or other suitable conveyance adapted to transport the substrate 105 through the test system 100. In one embodiment, any of these support and/or transfer mechanisms are configured to only move along one horizontal directional axis. The chamber height of the load locks 120A, 120B, and the testing chamber 110 can be minimized as a result of the unidirectional transport system. The reduced height combined with the minimal width of the testing system provides a smaller volume in the load locks 120A, 120B and the testing chamber 110. This reduced volume decreases pump-down and vent time in the load lock chambers 120, 125 and the testing chamber 110, allowing enhanced throughput of the test system 100. The movement of the support table or the stage along a single directional axis may also eliminate or minimize the drives required to move the support table in the X direction.

According to embodiments described herein, the substrate is provided above a substrate carrier structure, the substrate and the substrate carrier structure are brought into contact for support of the substrate during testing or processing, and the substrate and the substrate carrier structure are separated again before the substrate is transferred to a transfer chamber, such as a load lock chamber after testing. According to different embodiments, which can be combined with other embodiments described herein, the substrate carrier structure can be a support and transfer structure, wherein the substrate carrier structure also transfers the substrate during testing. According to yet further alternative modifications, the substrate and the substrate carrier structure can be brought in contact by moving the substrate and/or by moving the substrate carrier structure. For example, the substrate can be transferred in the test chamber and over the substrate carrier structure. Then the substrate carrier structure is lifted to support the substrate. Alternatively or additionally, after the substrate has been transferred in the test chamber and over the substrate carrier structure, the substrate is lowered on the substrate carrier structure.

According to some embodiments, which can be combined with other embodiments described herein, the substrate carrier structure can be considered as forming a part of a support table that comes in contact with the substrate. In other words, the substrate touches or rests on the substrate carrier structure of the support table. Hence, the substrate carrier structure forms a substrate support.

Figure 2:
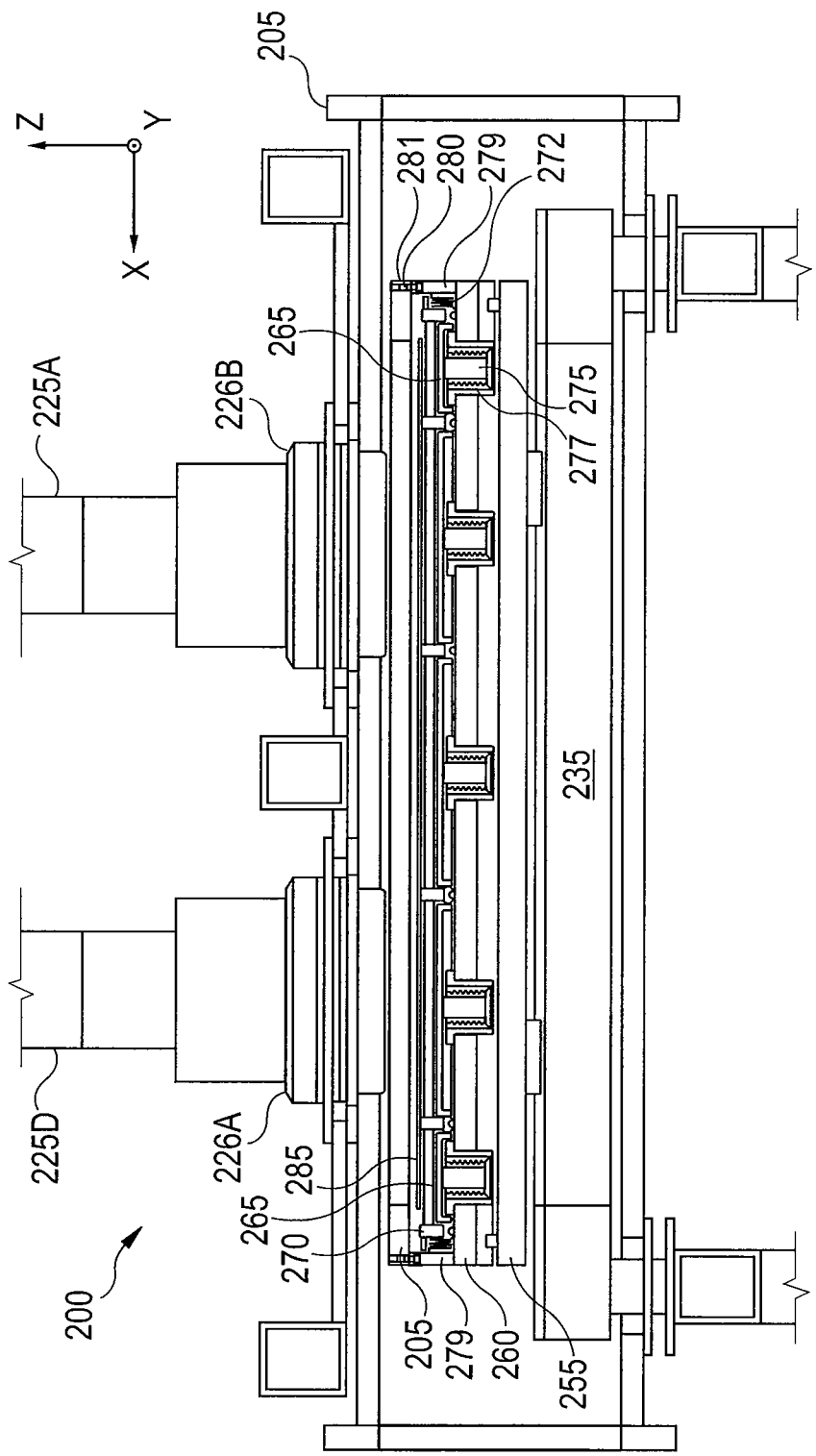
FIG. 2 shows a more detailed view of a test system, which can be used with embodiments as described herein.

According to some embodiments, which can be combined with other embodiments described herein, a substrate support or support table can be provided as shown in FIG. 2 in more detail. FIG. 2 shows an enlarged cross sectional view of the testing chamber 200. The support table includes a first stage 255, a second stage 260, and a third stage 265. The three stages 255, 260, and 265 are planar monoliths or substantially planar monoliths, and are stacked on one another. In one embodiment, each of the three stages 255, 260, 265 moves independently along orthogonal axes or dimensions. For simplicity and ease of description, the first stage 255 will be further described below as representing the stage that moves along the X-axis and will be referred to as the lower stage or X-stage 255. The second stage 260 will be further described below as representing the stage that moves along the Y-axis and will be referred to as the upper stage or Y-stage 260. The third stage 265 will be further described below as representing the stage that moves along the Z-axis and will be referred to as Z-stage 265.

Each of the lower stage 255 and the upper stage 260 may move side to side or forward and backward, depending on the orientation of the testing chamber 200. In other words, lower stage 255 and upper stage 260 both move linearly with respect to the same horizontal plane, but move in directions orthogonal to one another. In contrast, the Z-stage 265 moves in a vertical direction or the "Z direction". For example, the lower stage 255 moves side to side in the "X direction", the upper stage 260 moves forward and backward in the "Y direction" and the Z-stage 265 moves up and down in the "Z direction."

The lower stage 255 is coupled to a base or base unit 235 through a first drive system (not shown in this view). The first drive system moves the lower stage 255 linearly along the X axis. Similarly, the upper stage 260 is coupled to the lower stage 255 through a second drive system, (not shown in this view) which moves the upper stage 260 linearly along the Y axis. The first drive system is capable of moving the substrate table 250 in the X direction or dimension by at least 50 percent of the width of the substrate. Likewise, the second drive system is capable of moving the substrate table 250 in the Y direction or dimension by at least 50 percent of the length of the substrate. Examples of various components of the drive systems are described in U.S. Pat. No. 6,833,717, issued on Dec. 21, 2004, entitled "Electron Beam Test System with Integrated Substrate Transfer Module," which is incorporated herein by reference to the extent the application is not inconsistent with this disclosure.

As shown in FIG. 2, the testing chamber 200 further includes an end effector 270, which may be provided as a lift fork, to transfer a substrate 285 in and out of the testing chamber 200. In operation, the end effector 270 may be extended from the testing chamber 200 into the load lock chamber 120 to load a substrate. Likewise, the end effector 270 having a substrate loaded thereon may be extended from the testing chamber 200 into the load lock chamber 120 to transfer the substrate to the load lock chamber 120. A motion device, such as a linear actuator, a pneumatic cylinder, a hydraulic cylinder, a magnetic drive, or a stepper or servo motor, for example may be coupled to the end effector 270 to assist this transfer. In one embodiment, the end effector 270 includes a pair of bearing blocks 272 that permit the end effector 270 to move in and out of the testing chamber 200.

FIG. 2 shows one embodiment of the end effector 270 having four fingers which are evenly spaced, and which contact and support the substrate 285 when placed thereon. The actual number of fingers is a matter of design and is well within the skill of one in the art to determine the appropriate number of fingers needed for the size of substrate to be manipulated.

The Z-stage 265 is disposed on an upper surface of the upper stage 260. The Z-stage 265 can have a planar or substantially planar upper surface formed by the substrate carrier structure to contact and support the substrate 285 within the testing chamber 200. The Z-stage 265 is slotted or segmented such that each segment of the Z-stage 265 sits adjacent to a finger of the end effector 270. As such the Z-stage 265 and the end effector 270 can be interdigitated on the same horizontal plane. This configuration allows the Z-stage 265 to move above and below the end effector 270. Accordingly, the spacing between the segments of the Z-stage 265 corresponds to the width of the fingers of the end effector 270 plus some additional measure to assure clearance. Although five segments are shown in the cross sectional view of FIG. 2, the Z-stage may have any number of segments. According to some embodiments, which can be combined with other embodiments described herein, each segment can be provided with a respective substrate carrier structure or substrate carrier to form a common supporting surface on which the substrate will be placed.

According to different embodiments, which can be combined with other embodiments described herein, one or more Z-stage lifts 275 is coupled to the back side of each of the segments making up the Z-stage 265. Each Z-stage lift 275 is disposed within a channel formed in the upper stage 260, and a bellows 277 is arranged about each Z-stage lift 275 to reduce particle contamination within the testing chamber 200. The Z-stage lifts 275 move up and down vertically and may be actuated pneumatically or electrically. The bellows 277 compress and expand in response to the movement of the lift 275.

Figure 3A:
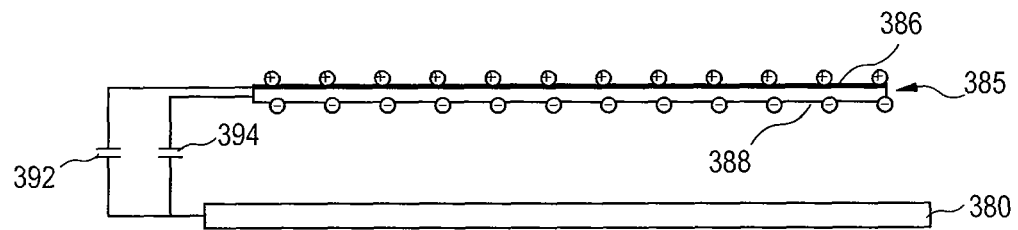
FIGS. 3A to 3C illustrate the occurrence of electrostatic charge during testing of a substrate.
Figure 3B:
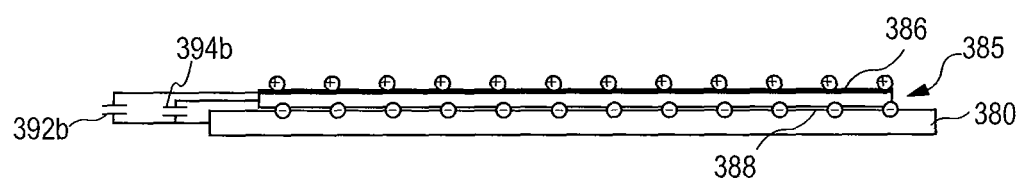
Figure 3C:
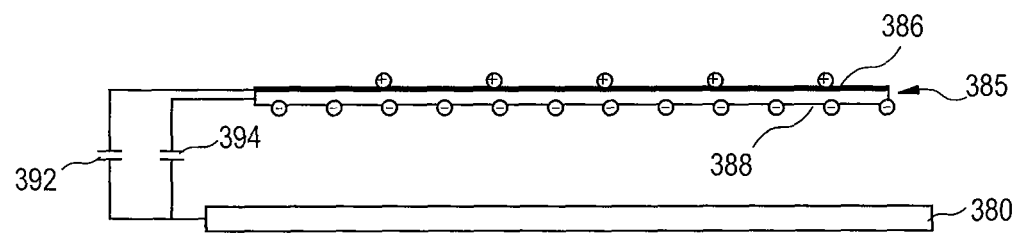
Figure 4A:
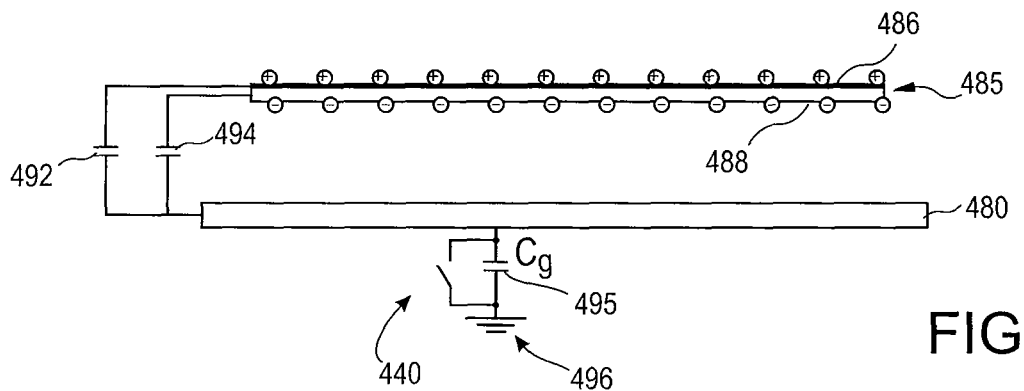
FIGS. 4A to 4D illustrate processes of a method according to an embodiment to reduce electrostatic discharge.
Figure 4B:
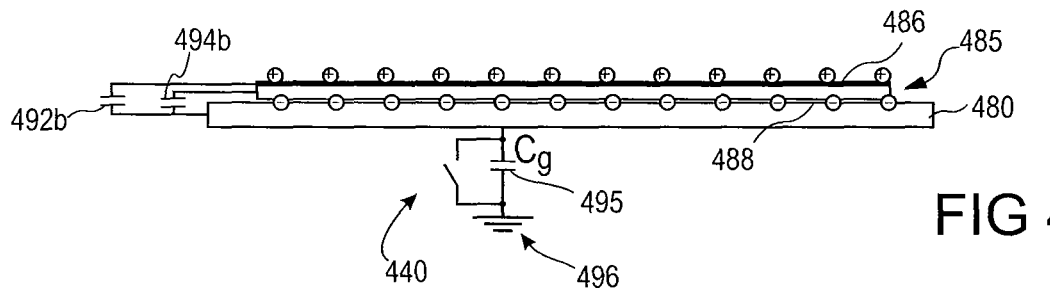
Figure 4C:
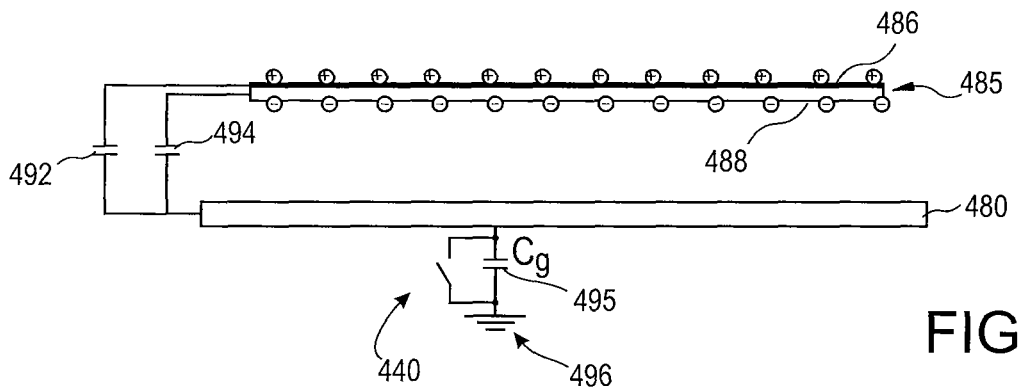
Figure 4D:
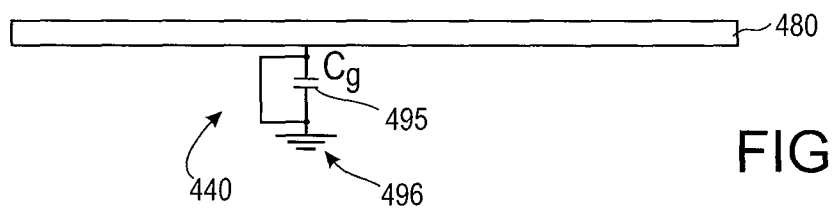

As described above, a substrate is loaded in a test chamber of a test system. Thereby, the substrate can be lowered on a substrate support such as the substrate carrier structure of a support table or the like. Alternatively, the substrate support can be lifted to support the substrate. According to a yet a further embodiment, the movement of the substrate and the substrate support can be combined. FIG. 3a shows a scenario for which the substrate 385 is distant from a substrate support 380. During testing, as shown in FIG. 3b, the substrate 385 is supported by the substrate support 380 such that the substrate 385 is in contact or at least partially in contact with portions of the substrate support 380, or floats slightly above the substrate, e.g., on an air cushion. After finishing the test procedure, in order to unload the substrate from the test chamber, the substrate 385 and the substrate support structure 380 are moved apart from each other in vertical direction (z-direction). Thereby, during handling of the substrate excessive voltages may occur and destroy electronic elements of the display or the entire display. Especially when the substrate is lifted off the stage, voltages up to several thousands of volts may occur. This is illustrated in FIG. 3C by the reduced number of positive charges on the upper surface 386 of substrate 385. This phenomenon may occur especially based on the fact that it is common practice to ground the substrate after the testing has been conducted in the test chamber. Moreover, processing of the upper surface can influence the charge distribution.

The above-described charge distribution, also referred to as electrostatic charge (ESC), may be influenced by a plurality of factors such as the initial charge on the substrate and the polarization thereof. For example, one surface of the substrate may be charged during a given process. The charge magnitude depends on process condition applied to the dielectric substrate, such as wet etch, dry etch, CVD, PVD, and the substrate interaction to its environment.

For compensation purposes, charges of opposite polarity can be brought to the other surface of the substrate, for example by ionizers. The substrate is then polarized. Measurements by a static volt meter, however, will indicate no or only little electrostatic voltage of the substrate since the charges compensate each other. Thereby, a process-dependent charge may be present before testing of the substrate. Further, an additional charge might be brought onto the substrate by a triboelectric effect. Further a capacitive coupling between the substrate and adjacent components may occur depending on the test system geometry and the materials used for the testing system. The electrostatic charge can thus vary based on past and present process steps conducted on the substrate and is difficult to be influenced. Accordingly, in the light thereof, the ESC may occur as follows: If a polarized dielectric substrate including, for example, a glass portion having device structures such as pixel electrodes or other conducting parts on an upper surface 386 thereof, is located remote from the substrate support 380, e.g. in a lifted position, the capacitance 392 of the substrate top and the capacitance 394 of the substrate bottom are considered to have similar values since the distances between the upper surface 386 and the substrate support 380 and between the lower surface 388 and the substrate support 380, respectively, are similar. Furthermore, both surfaces have about the same amount of charge but of opposite polarity and, therefore, no static voltage, or just a small non-destructive static voltage would be measured on the substrate or the upper surface 386, respectively. This is shown in FIG. 3A. According to some embodiments, which can be combined with embodiments of the invention described herein, the distance between the substrate 385 and the substrate support 380 might be about 15 mm in the lifted position. According to embodiments, which can be combined with other embodiments described herein, the glass substrate can have a thickness of about 0.7 mm.

When substrate 385 approaches substrate support 380, e.g. during placement of substrate 385 on the substrate support 380, as shown in FIG. 3B, the bottom or lower surface 388 of dielectric substrate 385 is significantly closer to the substrate support 380 than the upper surface 386 having the electronic devices formed thereon. The upper surface 386 is spaced apart from the substrate support 380 at least be the substrate thickness. A small distance between lower surface 388 and the substrate support 380 may remain. However, this distance is typically smaller than the substrate thickness. Accordingly, the capacitance 394b formed between the upper or top surface 386 of substrate 385 is smaller than the capacitance 392b formed between lower or bottom surface 388 of the substrate 385 and the substrate support 380. Since substrate support 380 is made of an electrically conductive material, mirror charges of opposite polarity can be influenced forming a positive charge at the upper surface of the substrate support 380. The mirror charges partially compensate the electric field of the negative charges on lower surface 388 of substrate 385. As a result, the charges on the upper and lower surface 388 of substrate 385 do not completely compensate each other any longer and a static voltage can be detected, which will be in the embodiment illustrated in FIG. 3 positive. It goes without saying that the opposite charge relations will be established when the substrate 385 is oppositely polarized.

During testing, as described above, a prober bar or prober frame contacts the electronic elements on the upper surface of substrate 385. The prober bar is commonly grounded before or after the test procedure. Thereby, the electronic elements on the substrate 385 are forced to ground potential, which causes an inflow or drain of charge carriers depending on the substrate pre-condition. Then the prober bar is disconnected from the substrate and no further charge flow occur, i.e. the amount of charge remains constant.

In the subsequent lifted position for unloading the substrate, see FIG. 3C, the substrate 385 is spaced apart form from the substrate support 380, for example by a given distance. In this situation, the capacitances 392 and 394 are almost equal again and significantly smaller than during the previous condition—i.e. during the placement of substrate 385 on the substrate support 380, as shown in FIG. 3B. Due to the increased distance from the substrate support 380, the capacitive coupling of the lower face of substrate 385 with substrate support 380 is also significantly reduced so that less or no mirror charges are influenced in the substrate support 380. Since the charge on the upper surface has significantly changed during testing contrary to the charge on lower surface 388 an electrostatic voltage is observable which can be up to several thousand volts. This can cause an electrostatic discharge which may destroy electronic elements on the upper surface. It should be noted that the charges on both surfaces do not change during lifting up. Rather, the capacitive coupling to substrate support decreases and, hence, the charge imbalance between upper and lower surface is not any more counteracted by mirror charges influences in the substrate support 380. Since the capacitances become small while the charges remain constant during lift-up, the voltage between upper surface 386 and substrate support 380 and between lower surface 388 and substrate support 380, respectively, increases and, hence, also the difference between these voltages, which difference may increase up to several thousand volts.

While FIG. 3C indicates a general charge reduction on the upper surface of substrate 385, an inhomogeneous charge distribution may also occur. This can lead to lateral discharges along the upper surface, for example within the same device such as a TFT-display or within adjacent devices. Lateral discharge is also of great concern. Particularly polarized glass substrates are critical to develop high voltages during handling.

In order to increase the yield of the system by reducing or avoiding electrostatic discharge, embodiments of the present invention can provide a charged compensation or charge variation reduction as described herein. FIGS. 4A to 4D illustrate an approach to avoid or reduce occurrence of electrostatic imbalance. According to different embodiments, which can be combined with other embodiments described herein, a polarized dielectric substrate 485 carrying charges of opposite polarity on both of its major surfaces is brought into close contact with a substrate support 480 such as a substrate carrier structure. At an initial stage, substrate 485 is spaced apart from substrate support 480 by a given distance, similar to the situation illustrated in FIG. 3A. In this situation, the capacitance 492 formed between the upper surface of substrate 485 and the substrate support 480 on one hand and the capacitance 494 formed between the lower surface 488 of substrate 485 and substrate support 480 on the other hand are small and substantially the same. Hence, the capacitive coupling to substrate support 480 is small.

Different to the situation of FIG. 3, substrate support 480 is insulated from ground as indicated by capacitance 495 which electrically insulates substrate support 480 from ground 496. Substrate support 480 is therefore floating with respect to ground 496. In other words, a ground matching between substrate 485 and substrate support 480 is provided. According to different embodiments, which can be combined with other embodiments described herein, the electrical insulation of substrate support 480 by capacitance 495 can be in a range from about 1 nF to about 100 nF. According to different embodiments, which can be combined with other embodiments described herein, substrate support 480, for example a substrate carrier structure as described below, can be electrically connected to ground 496 by a separate capacitor formed by a lump element to tailor the electrical conditions. According to different embodiments, which can be combined with other embodiments described herein, no separate capacitor is provided and the capacitive coupling to ground is established through the design of the substrate support 480, for example by providing respective insulating means which prevents a conductive path (ohmic connection) from the portions of the substrate support, which are in contact with the substrate, to ground. In either case, no permanent electrical connection to ground is formed.

According to different embodiments, which can be combined with other embodiments described herein, a switching unit 440 can be provided to connect temporarily substrate support 480 with ground 496 if needed. Switching unit 440 bypasses capacitance 495.

When substrate 485 approaches substrate support 480, i.e. when the distance between substrate 485 and substrate support 480 becomes small, capacitances 492 and 494 increase to become 492b and 494b as described above. Again, mirror charges will be influenced in substrate support 480. However, substrate support 480 is decoupled from ground 496 by capacitance 495. This means that capacitance 495 is electrically connected in series with capacitances 492b and 494b. Due to the capacitive decoupling of substrate support 480, the capacitive coupling between the substrate 485 and ground 496 is reduced. This means that the rise of the capacitance with respect to ground is significantly smaller as is the case for a grounded substrate support. Furthermore, the electrical potential of the electrically floating substrate support 480 will raise when the substrate 485 is placed thereon and this also reduces generation of a large mirror charge.

Without wishing to be tight to theory, the reduction of the capacitance variation during approaching can be illustrated when considering the total capacitance C between the substrate and ground. Assume that the capacitance between substrate 485 and substrate support 480 is $C_1$ and the capacitance 495 between substrate support 480 and ground 496 is $C_g$. Then the following relations applies:

$$\frac{1}{C} = \frac{1}{C_1} + \frac{1}{C_g} \Rightarrow C = \frac{C_1 * C_g}{C_1 + C_g}$$

Hence, the variation of the total capacitance C is reduced with respect to a grounded substrate support and, therefore, also the variation of the voltage of the substrate with respect to ground. A more detailed consideration takes account for the capacitance variation between the upper surface of the substrate and ground and between the lower surface of the substrate and ground, respectively. However, the above relation shows that both capacitances will vary to a considerably smaller degree for a floating substrate support than for a grounded substrate support. Therefore, the corresponding variation of the electrostatic voltage is also reduced.

For example, when $C_g$ is appropriately selected to be in the range of $C_1$ or even smaller than $C_1$, the total capacitance C will be roughly $C_g$. This means that only a small variation of the total capacitance C is observable and, hence, also only a small voltage variation. The value of $C_1$ can be estimated according to $$C_1 = \varepsilon_r * \varepsilon_0 \frac{A}{d}$$

with $\varepsilon_0$, being the vacuum permittivity, $\varepsilon_r$ the relative permittivity, A the area of the substrate and d the distance between the upper and lower surface of the substrate from the substrate support, respectively. The distance between the lower surface of the substrate from the substrate support can be approximated by a mean distance d since the entire lower surface of the substrate is typically not in contact with the substrate support. For example, the substrate support can have a structured surface so that only a partial contact is provided. For example, the surface can include burlings. Furthermore, the surface of the substrate support can have a certain roughness.

Furthermore, due to the reduced capacitance variation, only a small inflow or drain of charge carriers will occur when probing the devices on the upper surface 486 so that the charge on the upper surface 486 substantially remain constant. This also reduces the risk of generating or increasing a lateral inhomogeneous distribution of charge carriers.

Finally, the prober bar is disconnected from substrate 480 and no further charge flow occurs. When substrate 485 is lifted off substrate support 480, capacitances 492b and 494b reduce due to the increase of the distance to substrate support 480 and will reach values similar to capacitances 492 and 494, respectively. The change of charges causes occurrence of an electrostatic voltage but to a smaller degree. Two effects reduce the substrate 485 voltage raise during the increase of the distance to the substrate support 480: A) Since no charge imbalance, or only a little imbalance, was generated during probing, only a small electrostatic voltage will be measurable. B) Even if there is a little imbalance, it would not result in a significant substrate voltage raise, because the ratio between the starting capacitance 492b and 494b to the end capacitance 492 and 494 is significantly smaller than in the case of a permanently grounded substrate support as illustrated in FIGS. 3A to 3C. For example, estimations have indicated that, under otherwise equal conditions, the ratio between starting capacitances 492b and 494b to end capacitances 492 and 494, respectively, can be about 10 times or even higher for the grounded substrate support 380 than for a decoupled or floating substrate 480. This ratio can be influenced by appropriately selecting the capacitance value of $C_g$ 495. As a result of both effects, both lateral electrostatic discharges and electrostatic discharges to components within the chamber, which is not illustrated here, are avoided. Hence, for a floating substrate support 480 the change of charge during contacting or probing the substrate by a prober is significantly reduced compared to a grounded substrate support 480.

The electrical potential of substrate support 480 can be reset to ground by switching unit 440 to have predefined conditions before placing the next substrate. To this end, a control signal can be provided which causes switching unit 440 to temporarily connect substrate support 480 with ground 496.

Figure 10:
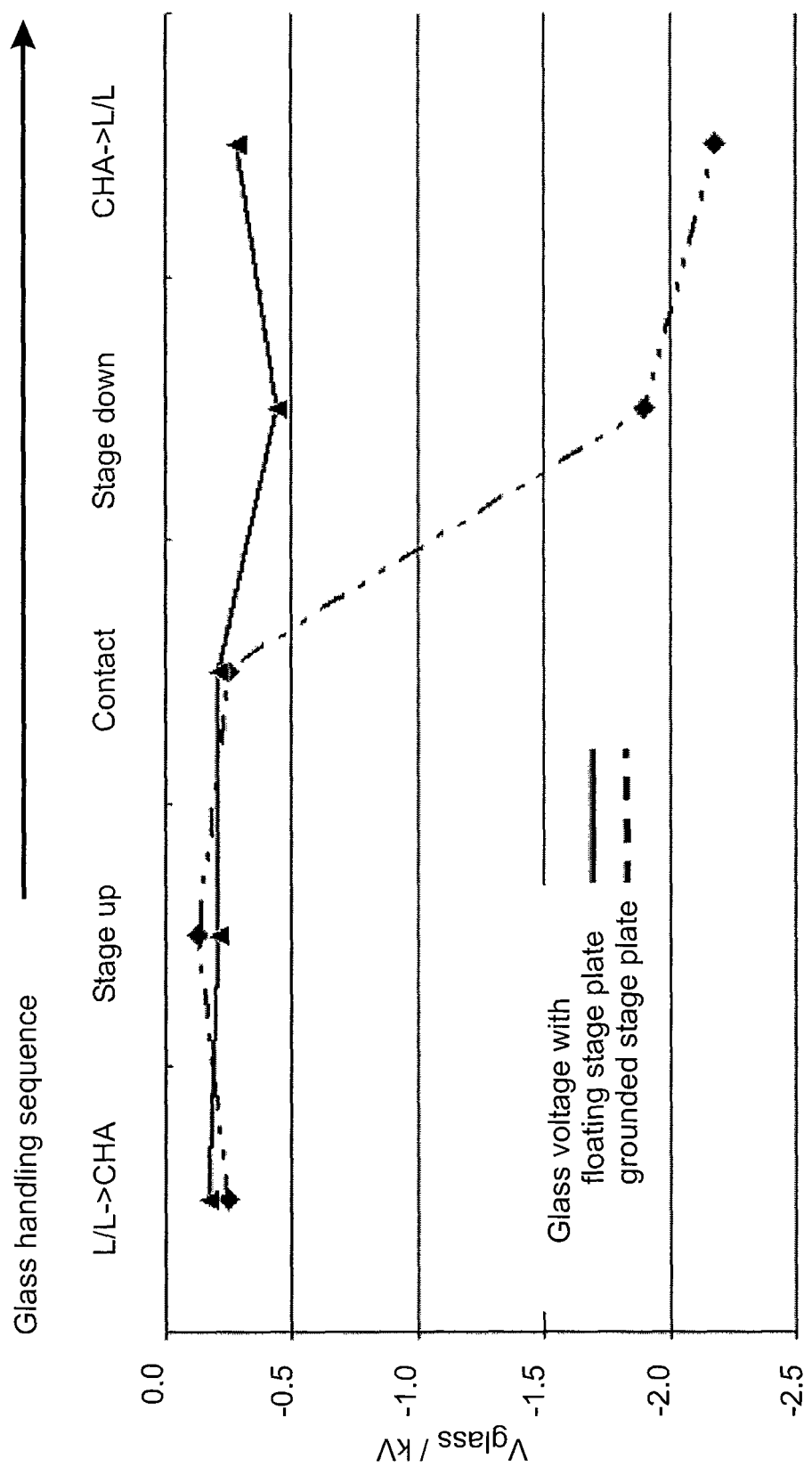
FIG. 10 shows the electrostatic voltage variation during testing of a substrate according to embodiments described herein and a commonly tested substrate.

For illustrating purposes, reference is made to FIG. 10 which shows the variation of the electrostatic voltage of glass substrates during handling. The electrostatic voltage, for example measured by a static voltmeter, has been measured for different handling sequences such as transfer from load lock to a chamber, denoted by "L/L-CHA"; approaching of the glass substrate to substrate support (stage) by lifting up the substrate support relative to the glass substrate, denoted by "Stage up"; contacting of the glass substrate with the substrate support, denoted by "Contact"; removing of the glass substrate from the substrate support by lowering the substrate support relative to the glass substrate after testing, denoted by "Stage down"; and transfer of the glass substrate from the chamber to the load lock, denoted by "CHA->L/L".

FIG. 10 indicates a small voltage variation for a glass substrate on an electrically floating substrate support in comparison to a glass substrate on a grounded substrate support, which experiences a significant voltage increase during lifting up and transfer to the load lock. As shown in FIG. 10, the electrostatic voltage can be maintained between 0 V and 500 V when using a floating substrate support (stage plate) while a substrate loaded onto a grounded substrate support or stage plate shows a voltage increase of up to nearly −2500 V. The tests have been made under the same conditions for both glass substrates such as same glass size and thickness, same chamber and same initial process conditions leading to a polarized glass substrate.

Figure 11A:
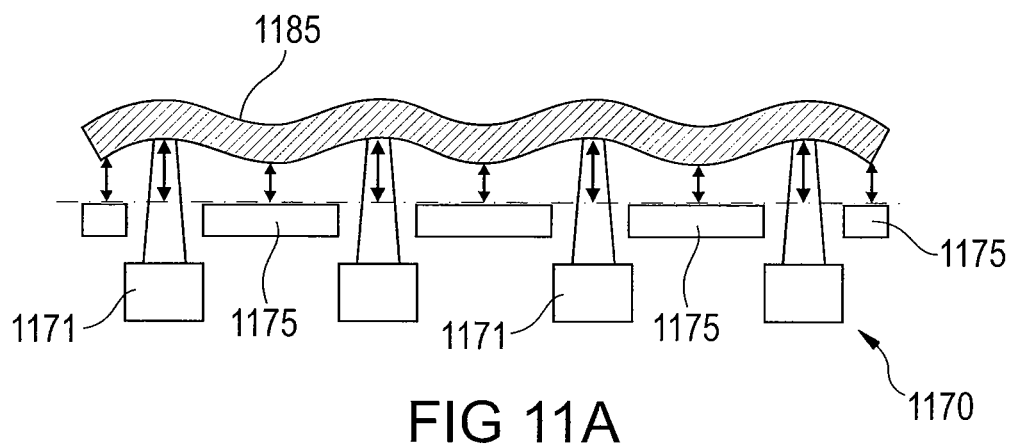
FIGS. 11A and 11B show a substrate-support spacing distribution during lifting-up.
Figure 11B:
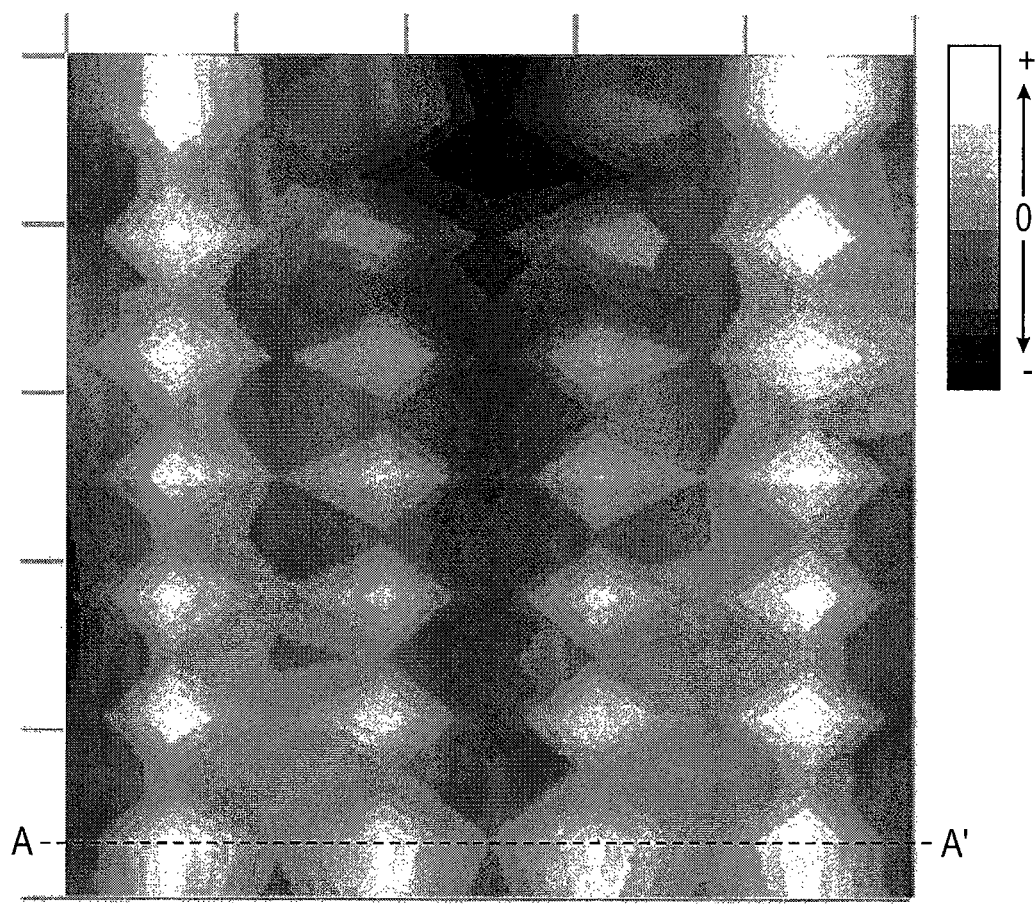

One reason for occurrence of lateral charge and voltage variation is illustrated in FIGS. 11A and 11B which shows handling of a glass substrate by an end effector 1170 having lifting fingers 1171. Lifting fingers 1171 provide a plurality of point-like contacts with substrate 1185. FIG. 11A illustrates a cross-sectional view along line AA' in FIG. 11B and shows the substrate 1185 in a lifted position above substrate support or substrate carrier structure 1175. Due to the point-like contact, the substrate 1185 can sag between the supporting points and might become undulated when lifted by lifting fingers 1171. Therefore, the distance between substrate 1185 and the substrate support 1175 varies laterally. Since the capacitance is indirectly proportional to this distance, a lateral capacitive variation occurs which also generates a lateral voltage variation. Furthermore, the end effector 1170 may be supported only on one side so that a bowing of the end effector 1170 may also occur which then also leads to a capacitance variation. Hence, the spacing distribution causes lateral voltage differences due to different capacitances between the areas of low spacing compared to areas with larger spacing. Furthermore, variation of the surface condition of the substrate support such as roughness and material may also affect the voltage variation. The voltage difference within a device or cell can cause ESD during movement of the substrate relative to the substrate support. Measurements have revealed that lateral voltage variations of several hundreds to thousands volts, e.g. 500 V to 600 V and higher, may occur.

FIG. 11B represents a topological map of a glass substrate 1185 when lifted by end effector 1170. The points of contact between the substrate 1185 and the respective lifting fingers 1171 are observable as positive bending while sagged regions are shown as negative bending.

The lateral variation of the capacitance and, hence, of the resulting electrostatic voltage is particularly pronounced at the beginning of the lifting process, where the variation of the distances significantly influences the capacitance. Large lateral voltage difference between adjacent displays on a substrate may result.

According to embodiments, which can be combined with other embodiments described herein, the lateral variation of the electrostatic voltage can also be significantly reduced when the substrate support is insulated from ground as described herein. Again, decoupling of the substrate support forms a capacitance which is electrically connected in series between the substrate-substrate support capacitance and ground.

Figure 5:
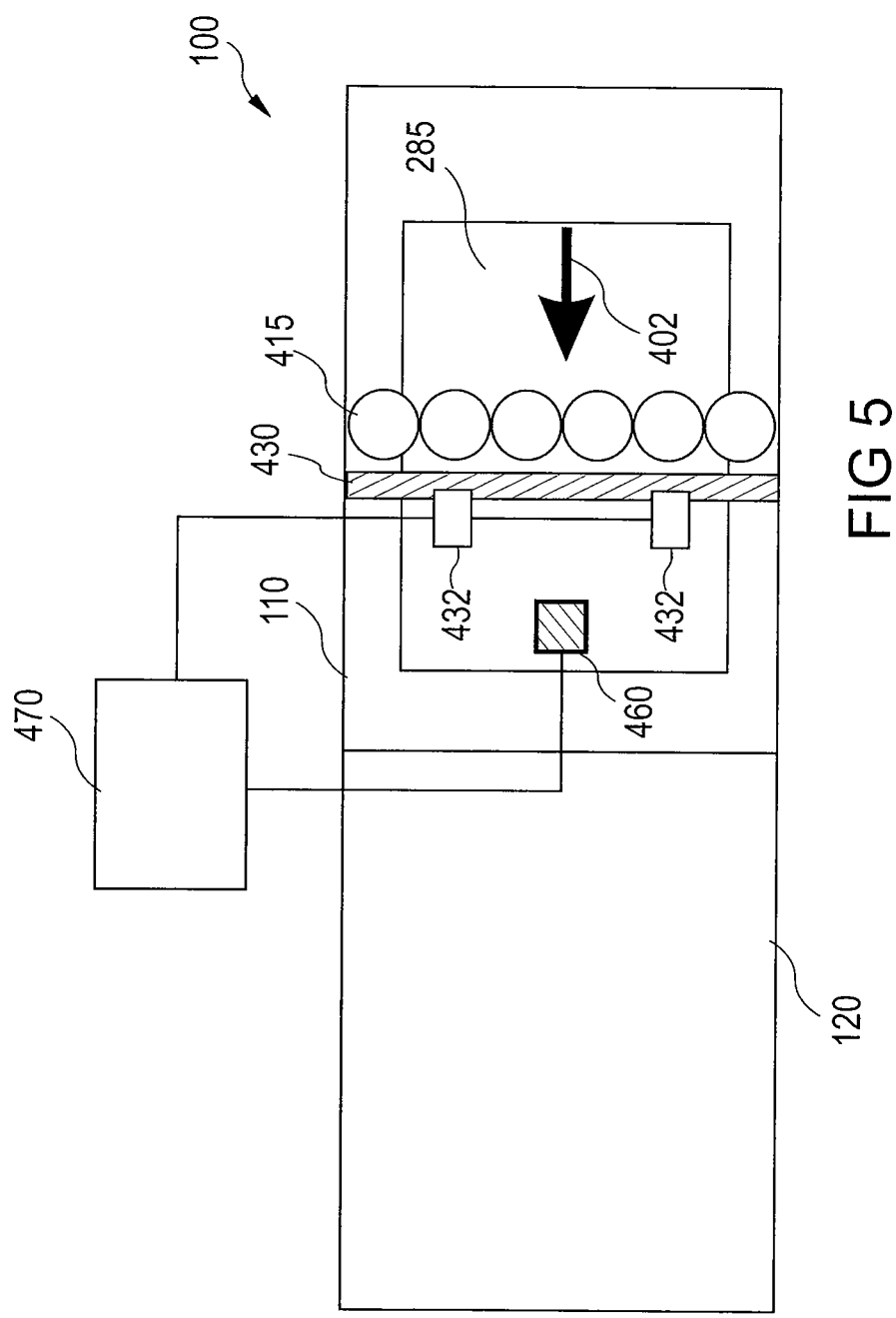
FIG. 5 shows a schematic illustration of a test system according to embodiments described herein.

FIG. 5 illustrates a schematic of a test system including a load lock chamber 120 and a test chamber 110. According to some embodiments, one or more of the following elements may be provided: one or more test columns 415, a prober bar 430 having prober heads 432 for contacting electronic elements on the substrate disposed thereon. According to some embodiments, which can be combined with other embodiments described herein, the prober heads 432 can be attached to the prober bar 430 such that they are movable in order to allow for an alignment of the contact positions for different substrate designs. According to yet further alternative or additional modifications, a prober frame with variable contact position, e.g., via re-positionable prober heads, adjustable frame bar positions, or the like, can be provided.

According to yet further embodiments, which can be combined with other embodiments described herein, a voltage measuring unit 460 can be provided. Typically, according to different embodiments, the voltage measurement unit can be adapted to measure an absolute value of the voltage on a substrate, e.g., the voltage measuring unit can be a static voltmeter. According to specific optional implementations, the voltage measuring unit is adapted for measuring a static voltage and/or can be adapted to measure an electric flux line. For example, an oscillating piezo-crystal can be used for measuring electric flux lines and, thereby, absolute voltage on the substrate.

According to yet further embodiments, which can be combined with other embodiments described herein, the voltage measuring unit 460 may be fixedly installed in the test system or the voltage measuring unit 460 may be removably installed in the test system, such that the voltage measuring unit can be used during installation of the test system and/or when a new product having a different process history and, thus, a different initial electrostatic charge, is used in the test system for the first time. According to yet further additional or alternative modifications, the voltage measuring unit may be installed within the test chamber or within the housing of the test chamber. According to yet further modifications, one or more voltage measuring units may be provided, which may for example, depend on the number of load lock chambers provided. For example, as shown in FIG. 1, if two load lock chambers are provided on each side of the test chamber, two voltage measuring units may be provided for measuring the static voltage on the substrate after loading and before unloading of the substrate.

A test system 100, as for example shown in FIGS. 1 and 2, can be used to apply the methods as described herein.

According to embodiments, which can be combined with other embodiments described herein, active voltage compensation can be additionally applied if desired. Active voltage compensation is for example described in U.S. Serial application Ser. No. 12/582,909, issued on Apr. 22, 2010 as US 2010/0097086, entitled "Apparatus and Method for Active Voltage Compensation" which is incorporated herein by reference to the extent the application is not inconsistent with this disclosure. Briefly, the inflow or drain of charges during testing is compensated after testing by a corresponding reversal charge flow. To this end, the voltage measuring unit 460, e.g. an electrostatic voltmeter senses the initial voltage V0 before placing the substrate 285 on the support and a voltage V1 when disposed on the support. The charge inflow or drain during testing is reversed after testing by applying a voltage corresponding to V1 to the tested devices. The voltage compensation can be verified by measuring a voltage V2 and comparing with V0 after having the substrate 285 lifted off from the support. The active charge compensation can be controlled by a control unit 470 which is in operable connection with voltage measuring unit 460 and prober heads 432.

As described above, according to embodiments described herein, for processes creating electrostatic charges, the variation or change of the charge can be reduced in a efficient manner by electrically decoupling the substrate support from ground when the substrate is placed thereon.

With respect to FIGS. 6A and 6B, embodiments of substrate support units arranged to avoid charge imbalances on the substrate will be described. According to embodiments, which can be combined with other embodiments described herein, a substrate support unit 600 includes at least a support table having at least one substrate carrier structure 675 to support a substrate 685. The substrate carrier structure 675 is electrically decoupled from ground 644 and, hence, floating with respect to ground. Upper surface of substrate carrier structure 675 is typically adapted to hold large dielectric substrates such glass substrates. The upper surface of substrate carrier structure 675, on which the substrate 685 will be placed, can be structured or can be an unstructured flat surface. Structured surface typically also form a planar support. Structuring of upper surface may include forming grooves or other structures. Substrate carrier structure 675 can be, for example, an aluminium stage plate which can include grooves.

According to embodiments, which can be combined with other embodiments described herein, substrate carrier structure 675 is comprised of an electrically conductive material such as aluminium, conductive plastic material, or conductive ceramic. Substrate carrier structure 675 is arranged, according to embodiments, which can be combined with other embodiments described herein, on a movable stage 665 of support table and electrically insulated therefrom by an insulating layer 670. In the embodiment illustrated in FIG. 6A, movable stage 665 is a Z-stage, i.e. is movable in vertical direction by drives or Z-lifts 666 which are supported by base unit 635. According to embodiments, which can be combined with other embodiments described herein, stage 665 can also be an X-stage or an Y-stage or a combination of any of the above described stages as illustrated in FIG. 6B. According to embodiments, which can be combined with other embodiments herein, the support table can include a sandwich structure formed by a stage 665, an insulating layer 670 and a substrate support structure 675. In other words, the support table can be configured to provide an electrical insulation of the substrate support structure 675.

Figure 6A:
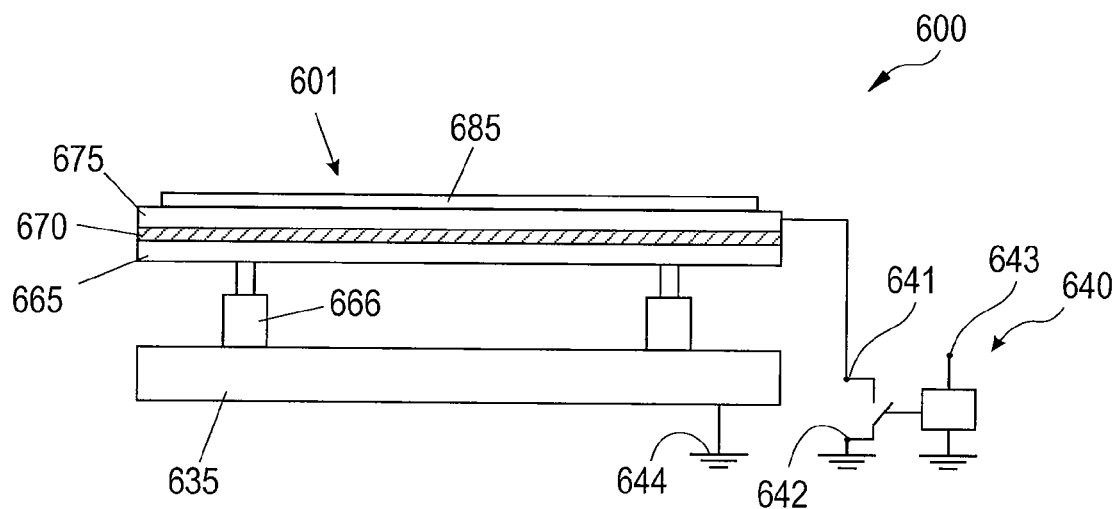
FIGS. 6A and 6B show substrate support units according to embodiments described herein.
Figure 6B:
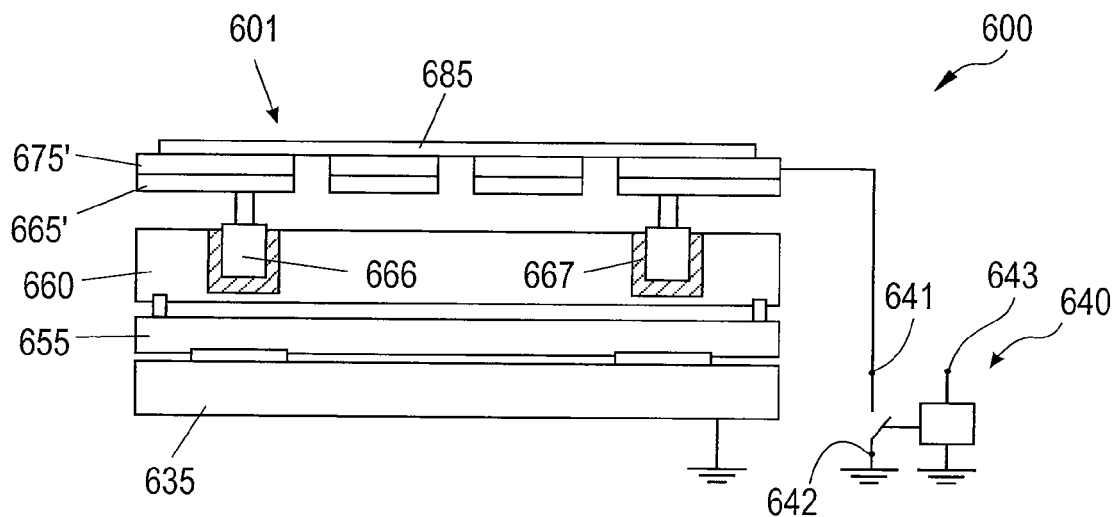

Insulating layer 670 also provides an electrical insulation between substrate carrier structure 675 and base unit which is grounded as illustrated in FIGS. 6A and 6B, respectively. Insulating layer 675 can be comprised of a material such as polytetrafluoroethylene (PTFE), commercially available as Teflon®, or a polyimide, an example of which is Kapton®. The material of insulating layer 670 can be selected according to specific needs such as to withstand the processing conditions to which the glass substrate is subjected during processing and testing. For example, insulating layer 670 can be selected to withstand temperatures, depending on the process conditions, of up to 1000° C. and should be suitable for high vacuum condition. For high temperature applications, an inorganic insulating material can be used. According to embodiments, which can be combined with other embodiments described herein, insulating layer 675 can have a thickness from about 0.1 mm to about 0.2 mm. A skilled person will appreciate that other thickness values can also be used as long as a sufficient electrical insulation is provided.

According to embodiments, which can be combined with other embodiments described herein, substrate carrier structure 675 can be temporarily connected to ground by switching unit 640. Switching unit 640 can include, according to embodiments, a first terminal 641, which is electrically connected to substrate carrier structure 675, a second terminal 642, which is electrically connected to ground 644, and a control terminal 643 for receiving a control signal. Switching unit 640 is typically controlled by a control unit running control software. Control unit 470 as illustrated in FIG. 5 can be used.

According to embodiments, which can be combined with other embodiments described herein, stage 665' can be segmented as illustrated in FIG. 6B. To each segment of movable stage 665' a substrate carrier structure 675' can be assigned so that a plurality of substrate carrier structures 675' form together a common support surface on which the substrate 685 rests. The clearance between adjacent segments is adapted to allow insertion of respective fingers of a lift fork as described above.

FIG. 6B also illustrates a support table having three stages, a lower X-stage 655 movable in X-direction (left right direction in FIG. 6A) with respect to base unit 635, an upper Y-stage 660 movable in Y-direction (direction perpendicular to the drawing plane) with respect to X-stage 655, and a Z-stage 665' movable in Z-direction (top-down direction in the drawing) with respect to Y-stage 660.

Different to the embodiment illustrated in FIG. 6A, substrate carrier structure 675' is in direct contact with Z-stage 665', i.e. is electrically connected thereto. However, Z-stage 665' is electrically insulated from Y-stage 660 by insulating means 667 which insulates Z-drives 666 from Y-stage 660. Insulating means 667 also holds Z-drives 666 in respective receptacles formed in Y-stage 660. Insulating means 667 can be made of any suitable material such as polyether ether ketone (PEEK), polyimide (for example Kapton®), or PTFE (for example Teflon®). According to embodiments, which can be combined with other embodiments described herein, the insulating means 667 are comprised of a material or material combination which provides sufficient material strength for fixing and holding Z-drives 666. Substrate carrier structure 675' is also electrically insulated from base unit 635 and therefore also from ground 644 in FIG. 6B.

Insulating Z-drives 666 from Y-stage 660 also allows refitting existing processing and testing tools for obtaining tools having a floating stage or floating substrate carrier structure. For example, insulating connecting means such as screws made of PEEK can be used. Furthermore, nylon washers have been proven to be suitable for electrical insulation.

Figure 7:
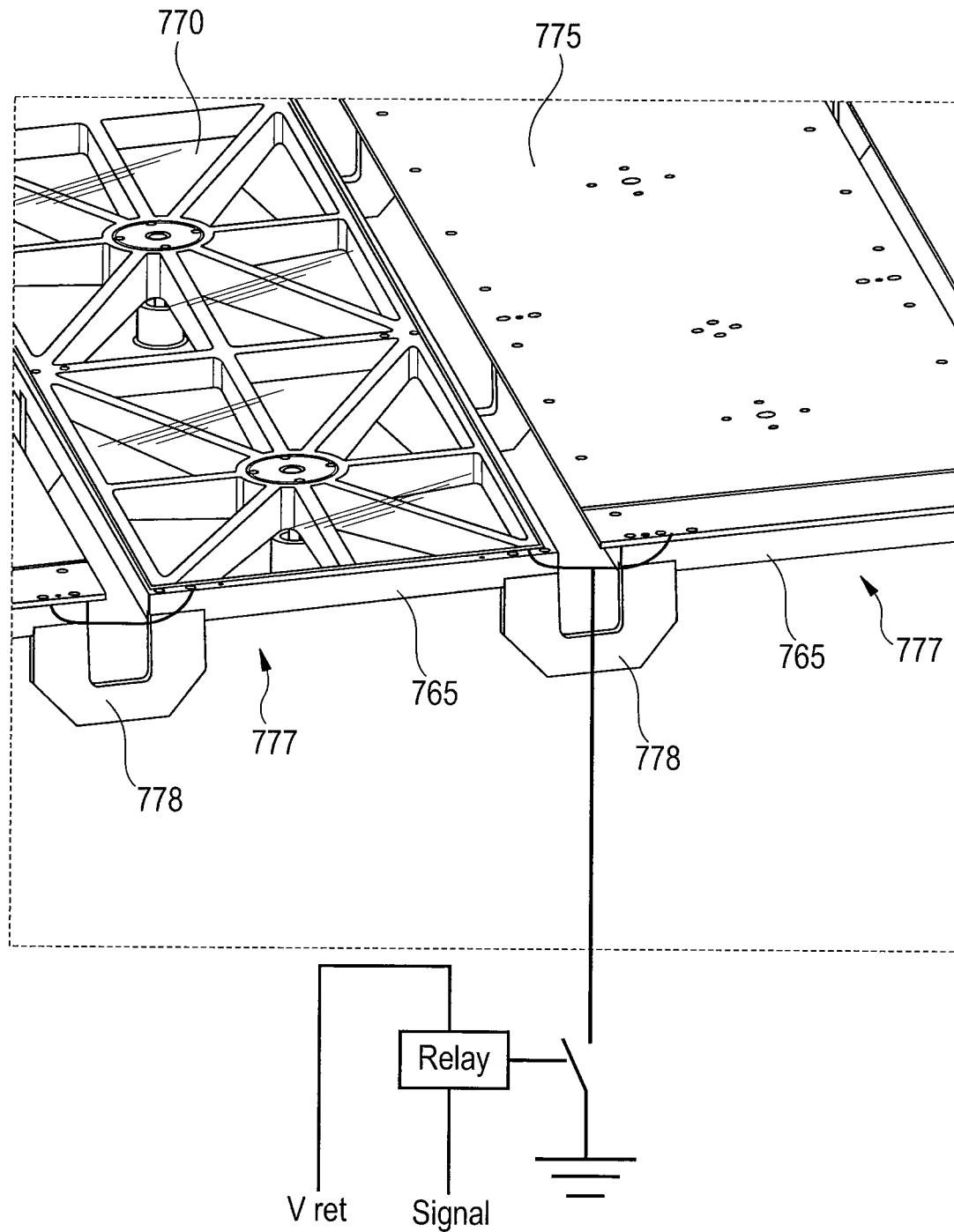
FIG. 7 shows a detail of a substrate support unit according to embodiments described herein.

With respect to FIG. 7, further embodiments, which can be combined with other embodiments described herein, will be described. FIG. 7 illustrates a segmented Z-stage 765 comprising a plurality of individual segments 777 which are connected with each other by bridges 778. Each Z-stage segment 777 is comprised of an electrically conductive material such as aluminium and includes a framework defining an upper plane on which an insulating layer or foil 700 is disposed. Foil 770 covers the upper faces of all parts of the framework on which the substrate carrier structure 775 is disposed. Substrate carrier structure 775 is formed in this embodiment by a plurality of stage plates each assigned to a respective Z-stage segment 777. In FIG. 7, one stage plate or stage segment is removed to illustrate the framework structure of the Z-stage segments 777 and also the foil. The distance between adjacent Z-stage segments 777 are designed to allow for sufficient space for a respective finger of a lifting fork.

The stage plates of the substrate carrier structure 775 are electrically connected with each other, for example by a wire or cable, and are electrically insulated from the Z-stage segments 777 by foil 770, i.e. the stage plates are floating. To maintain electrical insulation, only insulating fixation means such as non-conductive screws are used to fix the stage plates to the Z-stage segments 777. Substrate carrier structure 775 is, however, connected with a switching unit 740 to enable temporal electrical connection to ground. Switching unit 740 can be embodied as switch relay, or any other controllable switch. In embodiments, which can be combined with further embodiments described herein, switching unit 740 is arranged outside the chamber, particularly outside the vacuum area. The signal to switch the switching unit or relay can be controlled by control software used for testing or processing the substrates.

Furthermore, the stage plates can be electrically conductive and made of aluminium, for example. The upper surface of stage plates, on which the substrate will be disposed, can be structured, for example can include grooves.

Figure 8:
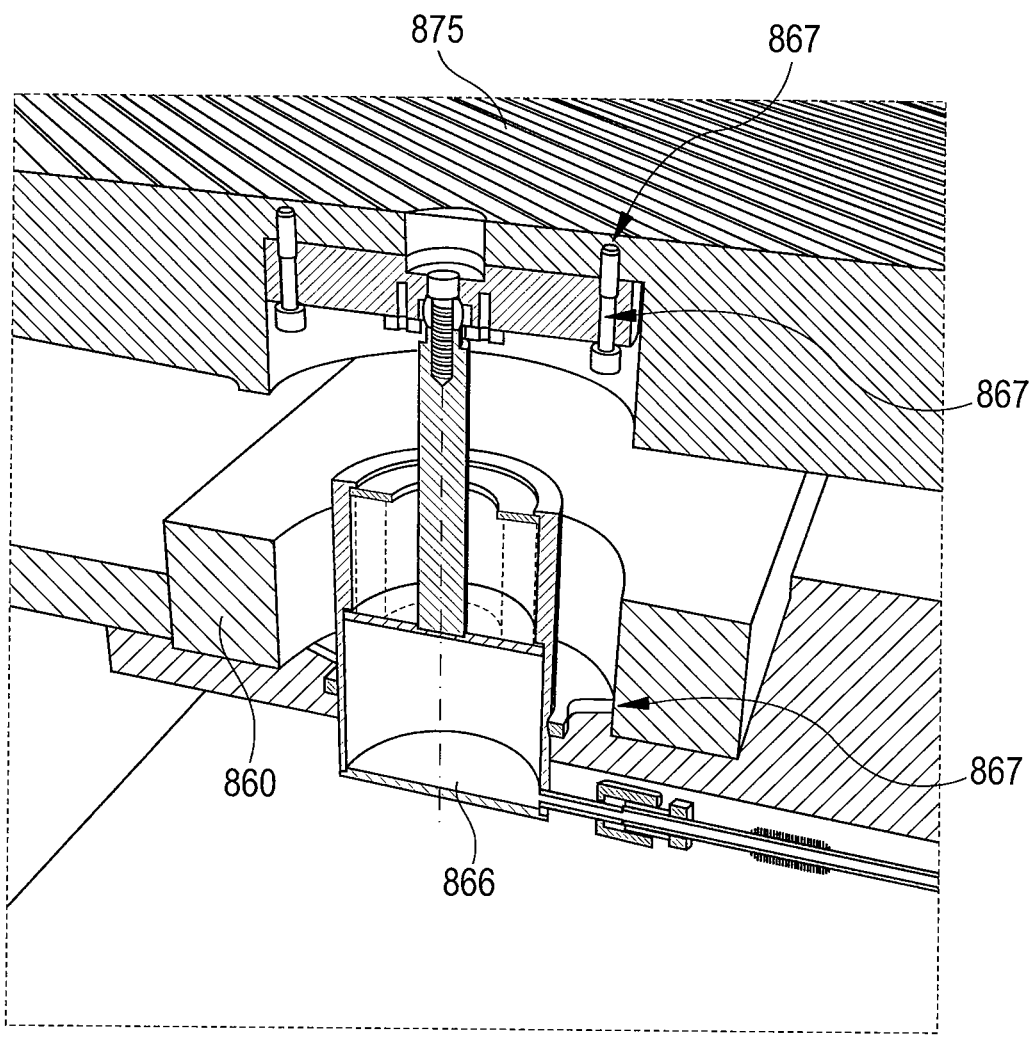
FIG. 8 shows a detail of a substrate support unit according to embodiments described herein.

FIG. 8 illustrates further embodiments, which can be combined with other embodiments described herein. Substrate carrier structure 875 can be partially or completely insulated from the Z-stage. Furthermore, Z-stage including Z-stage drives 866 are insulated from Y-stage 860 by suitable insulating means 867 and insulating fixation means such as washer, spacers, insulating screws. Again, this allows refitting of existing tools.

Figure 9:
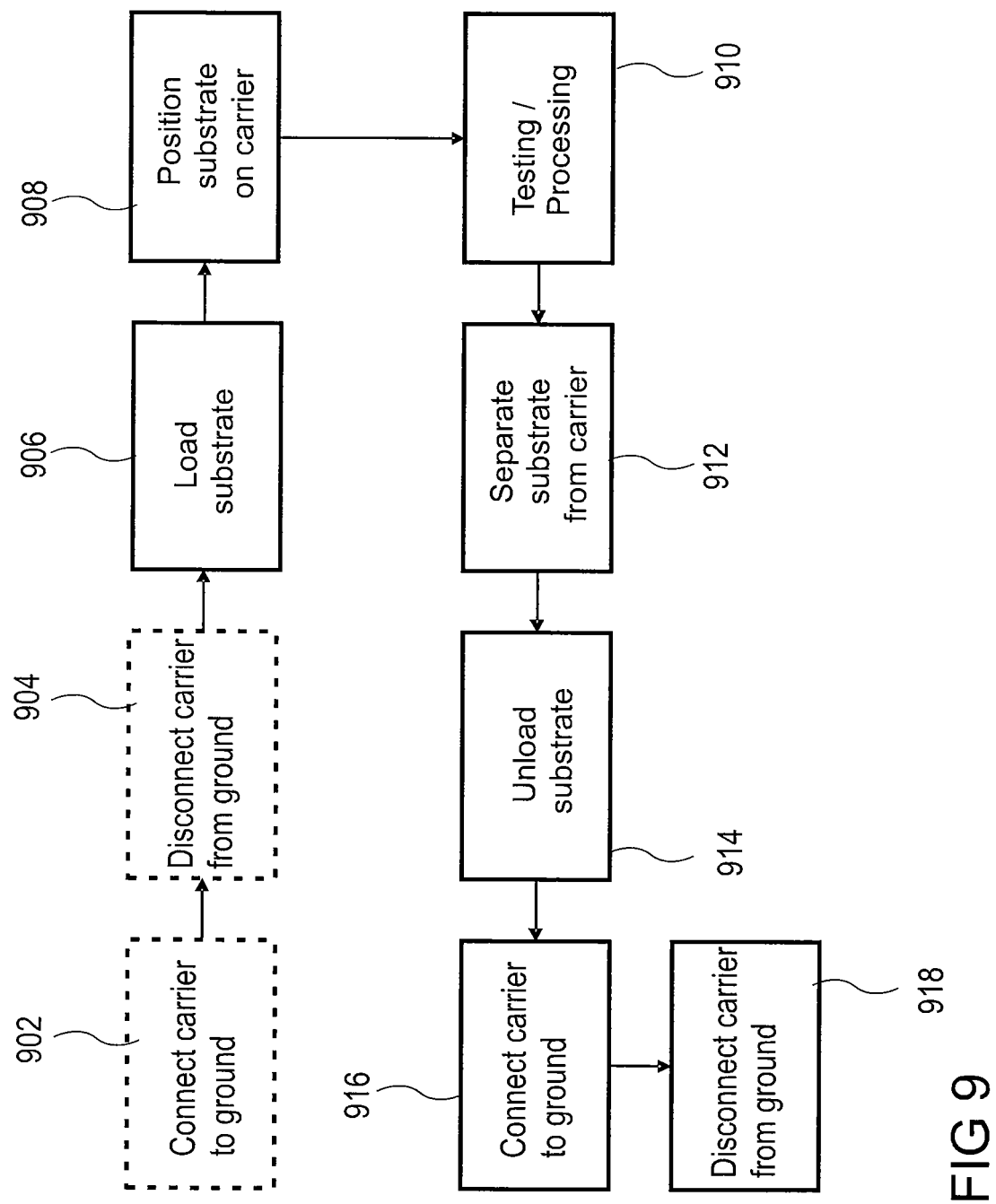
FIG. 9 shows a flow chart illustrating processes of a method according to embodiments described herein.

With respect to FIG. 9, processes of a method according to embodiments as set-forth herein will be described. Optional processes 902 and 904 can be used to set the substrate support, such as a substrate carrier structure as described above, to ground by electrically connecting the substrate carrier structure or the stage to ground, as indicated in process 902, for a given duration and then disconnecting it from ground, as indicated in process 904. Connection and disconnection can be provided by a switching unit which can be controlled by a control unit as described above. In a further process 906, the substrate is loaded into the chamber for testing or processing and then disposed in process 908 on the substrate support. Loading into the chamber and placing on the substrate support can be embodied as described above or by any other suitable processes. The substrate disposed on the substrate support is then tested or processed, as indicated in process 910. After finishing testing or processing, the substrate is separated from the substrate support in process 912, typically by a lifting fork and then unloaded from the chamber as illustrated in process 914. Substrate support is then electrically connected to ground as illustrated in process 916, for example by a controllable switching unit, to reset the electric condition. Electrical connection between substrate support and ground can be maintained until shortly before a further substrate is about to be loaded. This ensures defined initial electrical conditions. The electrical connection is interrupted, for example by switching unit upon reception of a control signal.

According to embodiments, which can be combined with other embodiments described herein, the substrate support unit can further include a base unit, wherein the substrate carrier structure is configured to be electrically insulated from the base unit.

According to embodiments, which can be combined with other embodiments described herein, the substrate carrier structure is comprised of an electrically conducting material.

According to embodiments, which can be combined with other embodiments described herein, the substrate support unit further includes a switching unit adapted to connect electrically the substrate carrier structure with ground.

According to embodiments, which can be combined with other embodiments described herein, the switching unit includes at least a first terminal for electrically connecting to the substrate carrier structure, at least a second terminal for electrically connecting to ground and at least a control terminal adapted to receive a control signal for controlling the switching unit.

According to embodiments, which can be combined with other embodiments described herein, the support table includes at least one movable stage adapted for moving the substrate carrier structure in at least one direction, wherein the movable stage is electrically insulated from the substrate carrier structure.

According to embodiments, which can be combined with other embodiments described herein, the support table has at least one movable stage adapted for moving the carrier stage in at least one direction, the movable stage is electrically floating with respect to ground.

According to embodiments, which can be combined with other embodiments described herein, the movable stage has at least two segments, wherein each segment is provided with a respective substrate carrier structure forming together a common supporting face.

According to embodiments, which can be combined with other embodiments described herein, the substrate support unit further includes an insulating structure such as an insulating layer or insulating means for insulating the substrate carrier structure from ground.

According to embodiments, which can be combined with other embodiments described herein, an apparatus for testing or processing a substrate is provided. The apparatus includes a chamber for having a substrate disposed therein, and a substrate support unit having at least one substrate carrier structure adapted to support the substrate when placed thereon, wherein the substrate support unit is configured to insulate electrically the substrate carrier structure from ground.

According to embodiments, which can be combined with other embodiments described herein, the apparatus further includes at least a load lock chamber attached to the chamber.

According to embodiments, which can be combined with other embodiments described herein, the apparatus is for testing electronic elements on the substrate, and wherein the chamber is a test chamber and the apparatus has one or more test columns for testing the electronic elements in the substrate.

According to embodiments, which can be combined with other embodiments described herein, the one or more test columns are electron beam test systems, and, alternatively or additionally, the one or more test columns are light optical test systems including an optical modulator which is adapted to couple capacitively to the electronic elements.

According to embodiments, which can be combined with other embodiments described herein, the apparatus further includes a switching unit adapted to connect electrically the substrate carrier structure with ground.

According to embodiments, which can be combined with other embodiments described herein, the apparatus further includes a prober for contacting the substrate when placed on the substrate carrier structure.

According to embodiments, which can be combined with other embodiments described herein, the apparatus further includes a voltage measuring unit, wherein the voltage measuring unit is adapted for measuring a voltage on the substrate.

According to embodiments, which can be combined with other embodiments described herein, a method for testing or processing a substrate is provided. The method includes disposing the substrate on a substrate carrier structure provided in a chamber, wherein the substrate carrier structure is electrically insulated from ground; performing at least one of testing and processing the substrate; unloading the substrate from the substrate carrier structure; electrically connecting the substrate carrier structure with ground.

According to embodiments, which can be combined with other embodiments described herein, the substrate is polarized when loaded on the substrate carrier structure.

According to embodiments, which can be combined with other embodiments described herein, disposing the substrate on the substrate carrier structure includes positioning the substrate spaced apart from the substrate carrier structure at a predetermined distance and moving at least one of the substrate and the substrate carrier structure to reduce the distance between the substrate and the substrate carrier structure for placing or carrying the substrate on the substrate carrier structure in a supporting position; contacting the substrate with a prober; testing or processing the substrate; breaking the contact between the prober and the substrate; wherein unloading the substrate includes moving at least one of the substrate and the substrate carrier structure to increase the distance between the substrate and the substrate carrier structure.

According to embodiments, which can be combined with other embodiments described herein, a substrate support unit is provided. The substrate support unit is adapted for a system for testing or processing a substrate and includes a substrate carrier structure to support a substrate, wherein the substrate carrier is electrically insulated from ground by a capacitance having a capacity of less than about 100 nF.

While the foregoing is directed to embodiments of the present invention, other and further embodiments of the invention may be devised without departing from the basic scope thereof, and the scope thereof is determined by the claims that follow.

The invention claimed is:

1. Substrate support unit adapted for a system for testing or processing of a substrate, comprising:
   a support table comprising at least one substrate carrier structure adapted to support a substrate, the substrate carrier structure being electrically floating, with respect to ground; and
   a switching unit adapted to electrically connect the substrate carrier structure with ground, wherein the switching unit is configured to electrically connect the substrate carrier with ground after unloading the substrate from the substrate carrier structure.

2. Substrate support unit of claim 1, further comprising a base unit, wherein the substrate carrier structure is electrically insulated from the base unit.

3. Substrate support unit according to claim 1, wherein the substrate carrier structure is comprised of an electrically conducting material.

4. Substrate support unit according to claim 1, further comprising a switching unit adapted to connect electrically the substrate carrier structure with ground.

5. Substrate support unit according to claim 1, wherein the switching unit comprises at least a first terminal for electrically connecting to the substrate carrier structure, at least a second terminal for electrically connecting to ground and at least a control terminal adapted to receive a control signal for controlling the switching unit.

6. Substrate support unit according to claim 1, wherein the support table comprises at least one movable stage adapted for moving the substrate carrier structure in at least one direction, wherein the movable stage is electrically insulated from the substrate carrier structure.

7. Substrate support unit according to claim 6, wherein the movable stage comprises at least two segments, wherein each segment is provided with a respective substrate carrier structure forming together a common supporting face.

8. Substrate support unit according to claim 1, wherein the support table comprises at least one movable stage adapted for moving the substrate carrier structure in at least one direction, the movable stage is electrically floating with respect to ground.

9. Substrate support unit according to claim 8, wherein the movable stage comprises at least two segments, wherein each segment is provided with a respective substrate carrier structure forming together a common supporting face.

10. Substrate support unit according to claim 1, further comprising an insulating structure for electrically insulating the substrate carrier structure from ground.

11. Substrate support unit adapted for a system for testing or processing of a substrate, comprising:
a support table comprising at least one substrate carrier structure adapted to support a substrate, the substrate carrier structure being electrically floating, wherein the support table comprises at least one movable stage adapted for moving the substrate carrier structure in at least one direction, wherein the movable stage is electrically insulated from the substrate carrier structure.

12. Substrate support unit according to claim 11, wherein the movable stage comprises at least two segments, wherein each segment is provided with a respective substrate carrier structure forming together a common supporting face.

13. Substrate support unit according to claim 11, further comprising a base unit, wherein the substrate carrier structure is electrically insulated from the base unit..

14. Substrate support unit according to claim 11, wherein the substrate carrier structure is comprised of an electrically conducting material.

15. Substrate support unit adapted for a system for testing or processing of a substrate, comprising:
a support table comprising at least one substrate carrier structure adapted to support a substrate, the substrate carrier structure being electrically floating, wherein the support table comprises at least one movable stage adapted for moving the substrate carrier structure in at least one direction, the movable stage is electrically floating with respect to ground.

16. Substrate support unit according to claim 15, wherein the movable stage comprises at least two segments, wherein each segment is provided with a respective substrate carrier structure forming together a common supporting face.

17. Substrate support unit according to claim 15, further comprising a base unit, wherein the substrate carrier structure is electrically insulated from the base unit..

18. Substrate support unit according to claim 15, wherein the substrate carrier structure is comprised of an electrically conducting material.

19. Substrate support unit according to claim 5, further comprising a base unit, wherein the substrate carrier structure is electrically insulated from the base unit.

20. Substrate support unit according to claim 5, wherein the substrate carrier structure is comprised of an electrically conducting material.

21. Substrate support unit according to claim 5, further comprising an insulating structure for electrically insulating the substrate carrier structure from ground.

* * * * *